（12）United States Patent
Rho et al.

(10) Patent No.: US 8,225,417 B2
(45) Date of Patent: Jul. 17, 2012

(54) CIRCUIT FOR CONTROLLING SIGNAL LINE TRANSMITTING DATA AND METHOD OF CONTROLLING THE SAME

(75) Inventors: Kwang-Myoung Rho, Ichon (KR); Jae-Jin Lee, Ichon (KR)

(73) Assignee: SK hynix, Inc. (KR)

( * ) Notice: Subject to any disclaimer, the term of this patent is extended or adjusted under 35 U.S.C. 154(b) by 1042 days.

(21) Appl. No.: 12/170,206

(22) Filed: Jul. 9, 2008

(65) Prior Publication Data

US 2009/0122621 A1 May 14, 2009

(30) Foreign Application Priority Data

Nov. 13, 2007 (KR) .................. 10-2007-0115477

(51) Int. Cl.
*G06F 1/26* (2006.01)
(52) U.S. Cl. ............................................. 726/36
(58) Field of Classification Search .............. 726/36; 713/300, 340, 401; 365/189.11, 194; 326/80
See application file for complete search history.

(56) References Cited

U.S. PATENT DOCUMENTS

| 5,933,048 A * | 8/1999 | Hidaka et al. ............ 327/534 |
| 7,466,609 B2 * | 12/2008 | Takahashi et al. ........ 365/194 |
| 7,663,945 B2 * | 2/2010 | Takahashi et al. ........ 365/194 |
| 7,750,714 B2 * | 7/2010 | Kim et al. ................. 327/291 |

FOREIGN PATENT DOCUMENTS

| JP | 08-106783 | 4/1996 |
| JP | 2006-093696 | 4/2006 |
| KR | 1020030078310 | 10/2003 |

OTHER PUBLICATIONS

English machine translation of Japanese patent Publication No. 08-106783, The abstract of this publication is submitted with IDS, Publication Date: Apr. 23, 1996.*
English machine translation of Japanese patent Publication No. 2006-093696, The abstract of this publication is submitted with IDS, Publication Date: Jun. 4, 2006.*

* cited by examiner

*Primary Examiner* — Samson Lemma
(74) *Attorney, Agent, or Firm* — Baker & McKenzie LLP

(57) ABSTRACT

A circuit for controlling a signal line transmitting data. The circuit includes a data level controller that, when the level of the data transmitted through the signal line is changed, controls the level of the data to be lower than an external power supply voltage level and higher than a ground voltage level after a predetermined time.

8 Claims, 4 Drawing Sheets

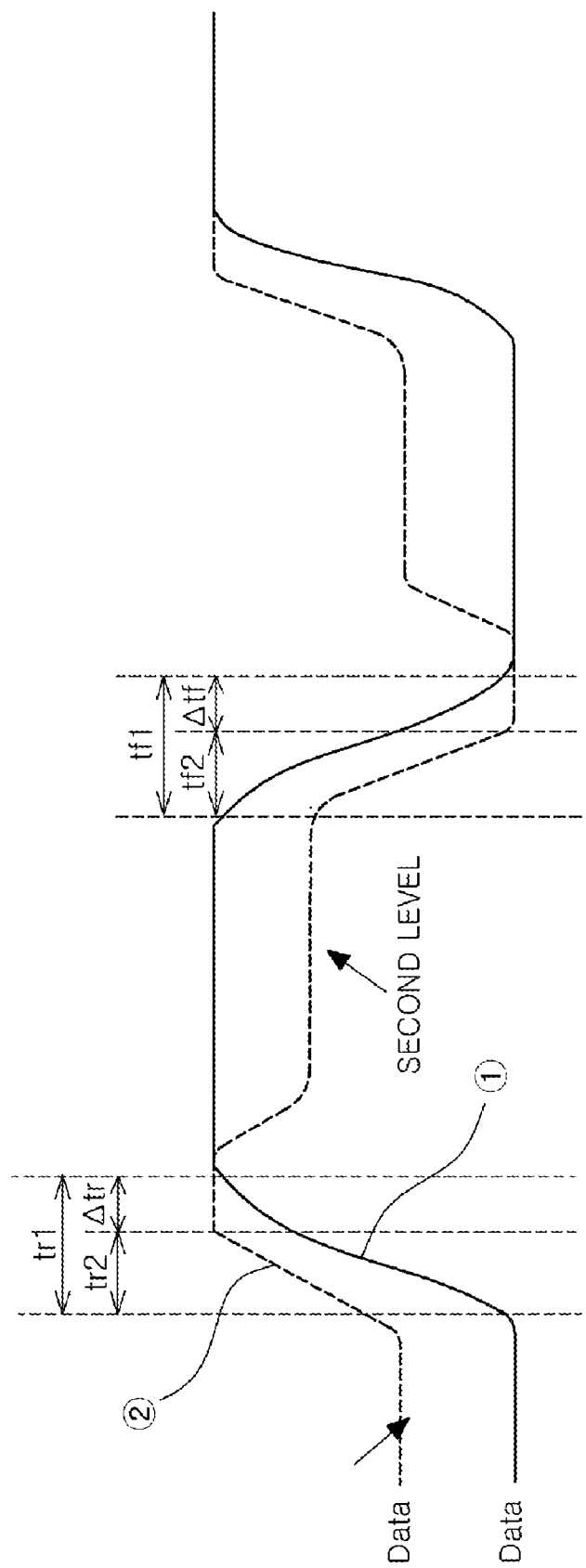

CIRCUIT FOR CONTROLLING SIGNAL LINE TRANSMITTING DATA AND METHOD OF CONTROLLING THE SAME

CROSS-REFERENCES TO RELATED APPLICATION

The present application claims priority under 35 U.S.C. 119(a) to Korean application number 10-2007-0115477, filed on Nov. 13, 2007, which is incorporated herein by reference in its entirety as if set forth in full.

BACKGROUND

1. Technical Field

The embodiments described herein relate to a semiconductor integrated circuit, and more particularly, to a circuit for controlling a signal line transmitting data and a method of controlling the same.

2. Related Art

Signal lines are used to transmit data between semiconductor integrated circuits or electronic devices. In conventional semiconductor integrated circuits and electronic devices the length of the transmission line can result in a delay in data transmission between such circuits or electronic devices. For example, during a data write operation, when data is input to a data input/output pad, the input data is transmitted to a multiplexing circuit through an input buffer. The multiplexing circuit multiplexes the input data and transmits the multiplexed data to a plurality of drivers. Then, the data is loaded to each global input/output (GIO) line. Therefore, the data is transmitted to a local input/output (IO) line connecting a bank and a memory cell block, and then written to cells selected by addresses.

On the other hand, during a data read operation, data from the cell is amplified by a corresponding bit line sense amplifier, and transmitted to the local input/output line. Then, the read data is amplified again by an input/output sense amplifier and transmitted to a pipe register through the GIO line. Then, the data is provided as output data through the data input/output pad. However, since the GIO line is shaped by all the banks, a very large amount of data is loaded to the GIO line for data transmission.

Due to increased integration of conventional semiconductor integrated circuits, e.g., semiconductor memory apparatus, the area of such devices has increased, and the length of the GIO line has also increased. Therefore, during a data write or read operation, when a large amount of data is loaded to the GIO line and the level of data is changed in a full swing range, a delay occurs during data transmission, which makes it difficult to perform high-speed data processing. In addition, when the level of the data varies in a full swing range, current consumption can increase.

SUMMARY

A signal line control circuit capable of improving a signal transmission rate and a method of controlling the same is described herein.

According to one aspect, a circuit for controlling a signal line includes a data level controller that is connected to the signal line and configured to receive high-level and low-level signals. The circuit is further configured to control the high and low levels of the signals after a predetermined time from the level transition of the signals.

According to another aspect, a circuit for controlling a signal line includes a data level controller that is configured to control the swing range of the signal line such that the swing range is smaller than a full swing range, which is a potential difference between the external power supply voltage and the ground voltage, when the level of the data transmitted through the signal line is changed to an external power supply voltage level or a ground voltage level.

According to still another aspect, a circuit for controlling a signal line includes: a data level controller that is configured to control the level of the data such that the level is lower than the external power supply voltage after a predetermined time from when the level of the data transmitted through the signal line is changed to an external power supply voltage level, wherein the data level controller is further configured to control the level of the data to be higher than the ground voltage after the predetermined time when the level of the data is changed to a ground voltage level.

According to yet another aspect, there is provided a method of controlling a circuit that controls a signal line transmitting data. The method including, when the voltage level of the data transmitted through the signal line is changed to a predetermined level, maintaining the changed level for a predetermined time; and controlling the voltage level of the data to be lower or higher than the changed level after the predetermined time.

These and other features, aspects, and embodiments are described below in the section entitled "Detailed Description."

BRIEF DESCRIPTION OF THE DRAWINGS

Features, aspects, and embodiments are described in conjunction with the attached drawings, in which:

FIG. 7 is a waveform diagram illustrating the operation of the circuit of FIG. 1 as compared to the operation of conventional circuits.

DESCRIPTION OF EXEMPLARY EMBODIMENT

A signal line control circuit configured in accordance with the embodiments described herein can reduce a signal delay while transmitting data through signal lines. As will be explained, as data is driven, it can be driven at a full swing level for only a predetermined time for which the data is processed. After the predetermined time, the data can be driven or stand by at a swing level lower than the full swing level. In this way, it is possible to improve the processing speed of the circuit during data transition.

Figure 1:
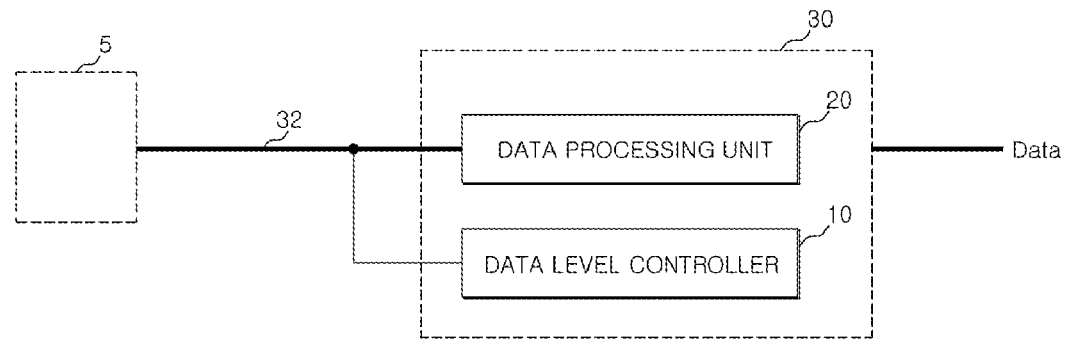
FIG. 1 is a block diagram illustrating a circuit for controlling a signal line transmitting data according to one embodiment.

FIG. 1 is a block diagram illustrating a circuit 30 configured to control signal lines for transmitting data in accordance with one embodiment. Referring to FIG. 1, the signal line control circuit 30 can include a data level controller 10 and a data processing unit 20. When the level of the data transmitted through the signal line 32 is changed, the signal line control circuit 30 controls the level of data to be lower or higher than the changed level after a predetermined time, thereby increasing the level transition speed of the data when the level of the next data is changed.

Thus, the data level controller 10 can be configured to receive data via signal line 32 and control the level of the data output through the data processing unit 20. The operation of data processing unit 20 will be described in detail below with reference to the accompanying drawings.

A signal driving block 5, which is not described in detail with respect to FIG. 1 can be the source circuit for driving the data on signal line 32.

Figure 2:
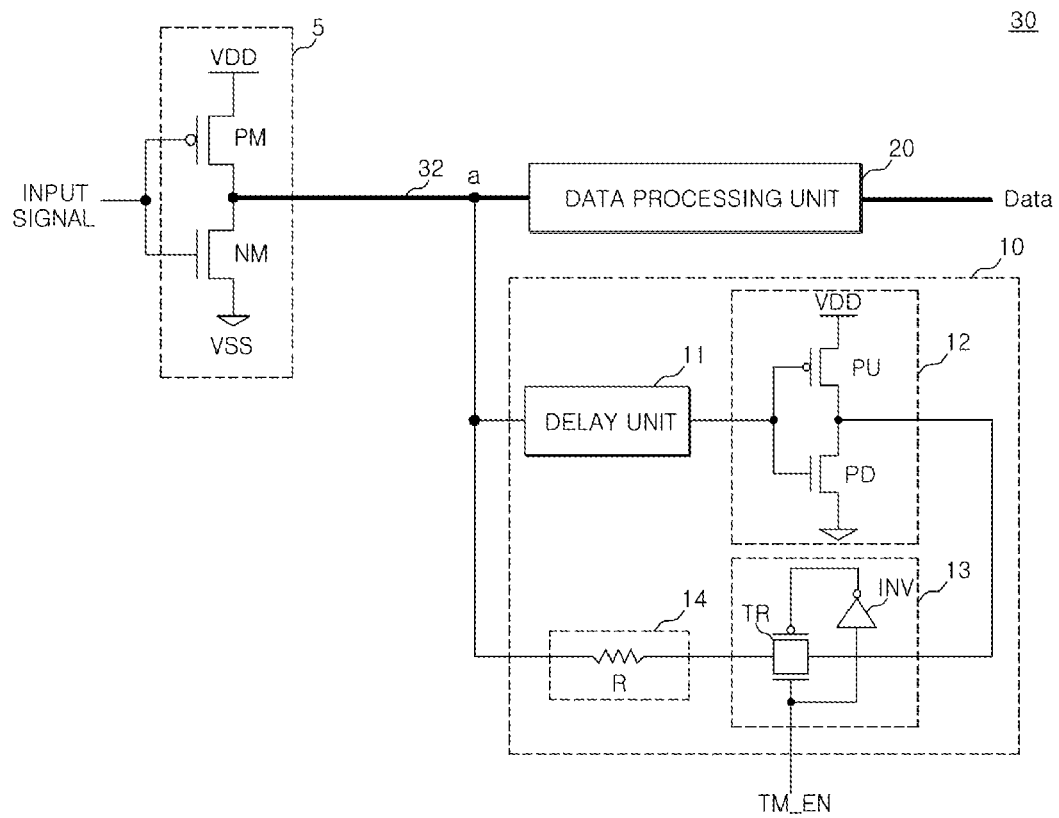
FIG. 2 is a detailed circuit diagram of the circuit illustrated in FIG. 1.

FIG. 2 is a detailed circuit diagram of the signal line control circuit 30 illustrated in FIG. 1. As can be seen, the data level controller 10 can include a delay unit 11, an inverting unit 12, a switching unit 13, and a resistor unit 14.

The delay unit 11 can be configured to delay the data received on signal line 32 by a predetermined time. The predetermined time is set to allow the data processing unit 20 to perform appropriate operations on the data. That is, the delay unit 11 can be configured to compensate for the time for which the data processing unit 20 processes the data Data. Moreover, the data level controller 10 can control the level of the data when the predetermined time has elapsed and after the data processing unit 20 has processed the data. Therefore, although not shown in the drawings, the delay unit 11 can include a plurality of delay elements, for example, a plurality of inverters for delaying data by a predetermined time.

In certain embodiments, for example, the delay unit 11 can be a replica circuit.

The inverting unit 12 can be configured to receive and invert an output signal from the delay unit 11. The inverting unit 12 can, e.g., include a pull-up element PU and a pull-down element PD. The pull-up element PU can be configured to provide a high-level signal in response to a low-level signal input to the inverting unit 12. The pull-down element PD can be configured to provide a low-level signal in response to a high-level signal input to the inverting unit 12. The pull-up element PU can include a gate that receives the output signal from the delay unit 11, a source that is supplied with an external power supply voltage VDD, and a drain that is connected to the pull-down element PD. The pull-down element PD can include a gate that receives the output signal from the delay unit 11, a source that is connected to a ground voltage terminal VSS, and a drain connected to the pull-up element PU. In this way, the inverting unit 12 can invert the level of the data received from the delay unit 11 to be lower or higher than the changed level of the next data received on signal line 32.

The switching unit 13 can be connected to an output terminal of the inverting unit 12, and can be configured to transmit an output signal from the inverting unit 12 in response to a test mode signal 'TM_EN'. The switching unit 13 can include an inverter INV and a transmission gate TR. When the switching unit 13 receives an activated high-level test mode signal 'TM_EN', the transmission gate TR can be turned on, and the switching unit 13 can transmit the output signal from the inverting unit 12. The test mode signal 'TM_EN' can be provided from a mode register set (MRS) or a fuse. In the embodiment illustrated in FIG. 2, the test mode signal 'TM_EN' is exemplified as an enable signal for enabling the switching unit 13.

The resistor unit 14 can include a resistor R that is connected to the output terminal of the switching unit 13. When the switching unit 13 is turned on, the resistor unit 14 can be connected to the drains of the pull-up and pull-down elements PU and PD. The resistor R can be configured to interfere with the current flow of the signal output from the inverting unit 12. In other words, the resistor unit 14 can be configured to make the level of the signal output from the inverting unit 12 weak. Therefore, the resistor R can have sufficient resistance to lower the level of the signal output from the inverting unit 12.

As described above, the data processing unit 20 can be configured to receive the data on signal line 32 and perform necessary processes on the received data. For example, the data processing unit 20 can be a data output controller that performs a read operation, or a data input controller that performs a write operation. That is, the data processing unit 20 can be configured to perform various functions according to the kind of circuits involved. However, any processing unit can be used as the data processing unit 20 as long as it can perform an appropriate operation on the received data as required for an internal circuit, wherein the data is transmitted through a long signal line or a signal bus.

The signal driving block 5 can be configured to provide high-level data corresponding to the external power supply voltage VDD or low-level data corresponding to the ground voltage VSS according to an input signal.

Next, the operation of the signal line control circuit 30 will be described in detail with respect to FIG. 3, which is a circuit diagram illustrating the operation of the data level control circuit 30 after a predetermined delay time has elapsed.

First, the case in which the switching unit 13 is turned on in response to an activated test mode signal 'TM_EN' and high-level data is transmitted through the signal line will be described. Referring to FIGS. 2 and 3, since the high-level data corresponding to the external power supply voltage VDD is transmitted, node (a) transitions to a high level. The data processing unit 20 can then perform an operation on the high-level data corresponding to the external power supply voltage VDD. Meanwhile, the delay unit 11 can delay the data by a time corresponding to the operation time of the data processing unit 20 and transmit the delayed data to the inverting unit 12.

Figure 3:
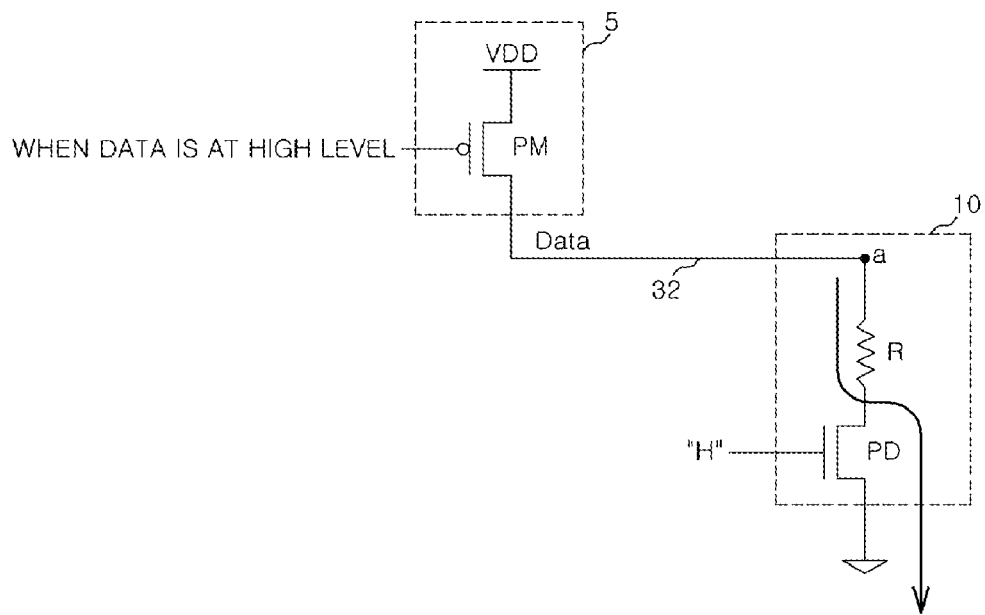
FIGS. 3 and 4 are equivalent circuit diagrams illustrating the operation of the signal line control circuit of FIG. 1 according to the voltage level of data.

In FIG. 3, the data can be maintained at a high level by a pull-up element PM of the signal driving block 5. Therefore, as shown in FIG. 3, the pull-down element PD of the inverting unit 12 receiving the high-level data through the resistor R pulls down the data to a low level. The final level of the data is determined by the driving capability of the pull-up element PM of the signal driving block 5, the driving capability of the pull-down element PD of the inverting unit 12, and the resistance of the resistor R. In this way, the level of the data can be controlled to be a high level that is slightly lower than the level of the external power supply voltage VDD.

Next, the operation of the data level control circuit 30 when low-level data is transmitted through the signal line 32 will be described with respect to FIG. 4, which is a diagram illustrating the operation of the data level controller 30 after a predetermined time has elapsed.

Figure 4:
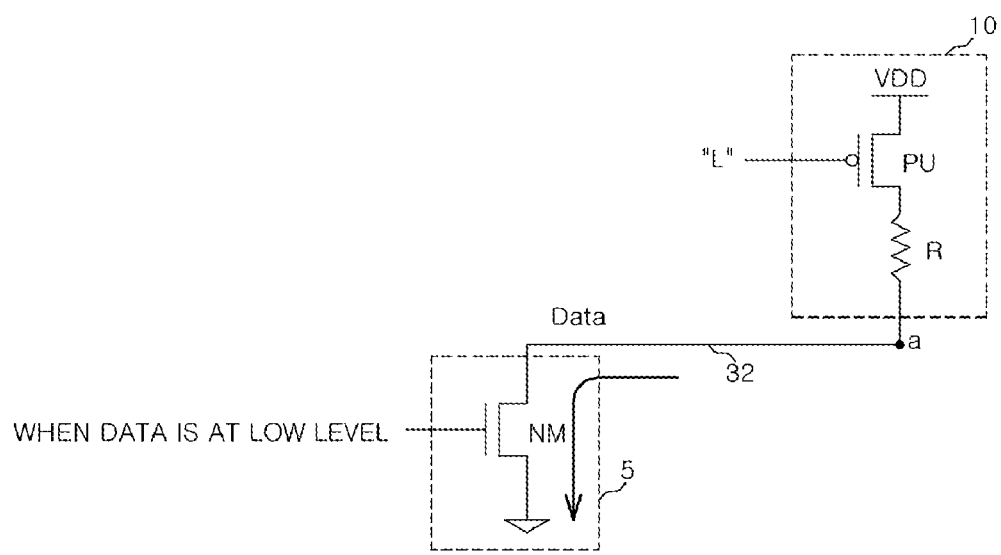

Referring to FIGS. 2 and 4, since the low-level data corresponding to the ground voltage VSS is transmitted, the node (a) transitions to a low level. The data processing unit 20 can then perform an operation on the low-level data corresponding to the ground voltage VSS. When a predetermined time has elapsed after the data has been completely processed, the pull-up element PU of the inverting unit 12 can respond to the low-level data.

In FIG. 4, the data is maintained at a low level by a pull-down element NM of the signal driving block 5. Therefore, as shown in FIG. 4, the pull-up element PU of the inverting unit 12 receiving the low-level data through the resistor R pulls up the data to a high level. The final level of the data is determined by the driving capability of the pull-down element NM of the signal driving block, the driving capability of the pull-up element PU of the inverting unit 12, and the resistance of the resistor R. In this way, the level of data can be controlled to be a low level that is slightly higher than the level of the ground voltage VSS.

As described above, according to certain embodiments, the data processing unit 20 can control the level of data such that the level of data swings to the external power supply voltage VDD or the ground voltage VSS when the level of data is changed. However, the level of data can be driven at a swing level that is smaller than the full swing level after a predetermined time, i.e., the minimum time required for the operation of the data processing unit 20, has elapsed. That is, the data processing unit 20 can be configured to perform an operation using data having a level corresponding to the external power supply voltage VDD or the ground voltage VSS. This is to ensure the operation of a general data processing unit 20. That is, reliable low-level or high-level data is required to perform the operation of the data processing unit 20. However, after the operation of the data processing unit 20 is stabilized, the level of the next data can be changed to a swing level that is lower than the full swing level, thereby increasing the level transition speed of the data.

In a conventional circuit or device, when the level of data transmitted through a long signal line is changed, a long rising time and a long falling time are required for full swing between the ground voltage VSS and the external power supply voltage VDD. However, in a circuit according to the embodiments described herein, after a predetermined time corresponding to the time needed to perform an operation on the data, the level of the data can be controlled, for example, post-charged. It will be understood that the term 'post-charge' means to control the level of the signal that is transmitted or stands by after having been processed by the data processing unit 20.

In this way, the level of the data that is in a standby state after having been processed by the data processing unit 20 can be controlled to be lower than the external power supply voltage VDD and higher than the ground voltage VSS. As a result, it is possible to improve the level transition speed of the data. In certain embodiments, the levels of the data are divided into a high level and a low level, and the levels of the data in the standby state are controlled on the basis of the two levels. However, the embodiments described herein are not limited thereto. For example, the level of the data in the standby state can be controlled to be half the potential difference between the external power supply voltage VDD and the ground voltage VSS, that is, VDD/2 (half of VDD).

Figure 5:
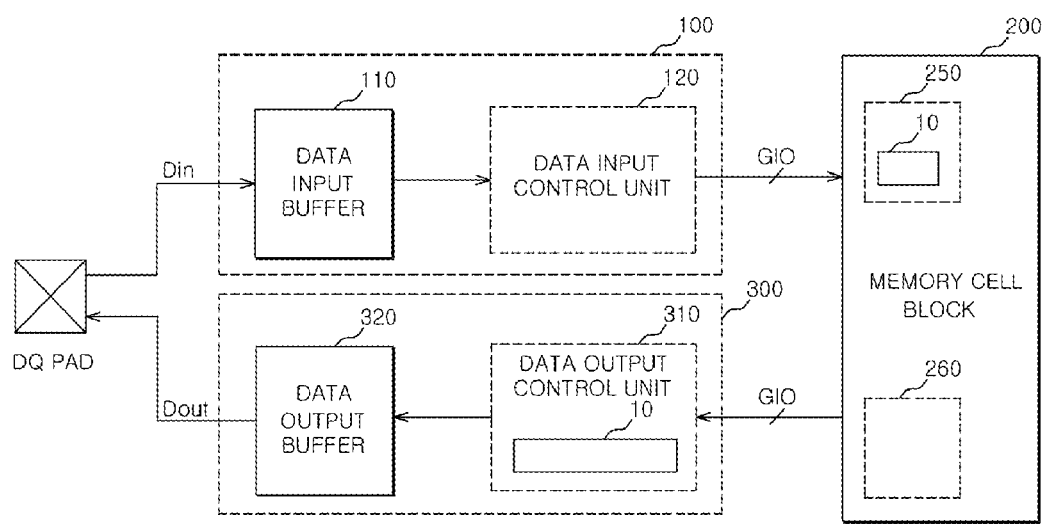
FIGS. 5 and 6 are block diagrams illustrating examples to which the signal line control circuit shown in FIG. 1 is adopted.
Figure 6:
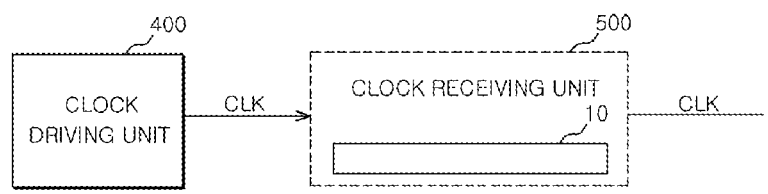

FIGS. 5 and 6 are block diagrams illustrating examples of circuits using the data level controller 10. First, FIG. 5 is a conceptual block diagram illustrating a semiconductor integrated circuit that controls data input and output. Referring to FIG. 5, the semiconductor integrated circuit includes a data input unit 100, a memory cell block 200, and a data output unit 300.

First, the data input unit 100 can include a data input buffer 110 and a data input controller 120. The data input unit 100 can be configured to receive input data 'Din' and transmit the received data to a global line GIO.

Specifically, during a write operation, the input data 'Din' can be provided from a data input/output pad DQ. The input data 'Din' can be transmitted to the data input controller 120 through the data input buffer 110. Although not shown in the drawings, the data input controller 120 can be configured to transmit the input data 'Din' to a plurality of input drivers (not shown) through a multiplexer (not shown) that multiplexes the input data 'Din'. Then, the input data 'Din' can be loaded to the GIO line. The input data 'Din' can be transmitted to a local input/output (IO) line connected to a bank (not shown) of a memory cell block 200, and then written to the cells selected by addresses.

A write driver control unit 250 of the memory cell block 200 can include a data level controller 10 configured in accordance with the embodiments described herein. Therefore, the data level controller 10 can control the signal level of input data 'Din' transmitted through the GIO line. As a result, it is possible to improve the transition speed of data transmitted through a long GIO line by controlling the signal level of the input data 'Din'.

When data is read from the memory cell block 200, the data can be amplified by a bit line sense amplifier (not shown) of the memory cell block 200 and further amplified by an input/output sense amplifier circuit 260. Then, the amplified data can be loaded to the GIO line. Then, the data can be transmitted to a pipe register (not shown) of a data output controller 310, and buffered by a data output buffer 320. Then, the data can be provided as output data 'Dout' through an input/output pad DQ. In this case, the data level controller 10 can control the level of data transmitted through the GIO line to be smaller than the full swing level. Therefore, it is possible to improve the transition speed of data transmitted through the GIO line by controlling the signal level of data transmitted through the GIO line with a large amount of load.

FIG. 6 is a block diagram illustrating a clock signal circuit including the data level controller 10 according to one embodiment.

Such a clock signal circuit can include a clock driving unit 400 and a clock receiving unit 500. The clock receiving unit 500 can include the data level controller 10. The clock receiving unit 500 is exemplified in FIG. 6 as a circuit unit that receives a clock signal 'CLK' and controls various functions.

The same scheme as described above can be applied to the clock signal transmitted through a signal line. That is, the clock receiving unit 500 can receive the clock signal 'CLK' generated by the clock driving unit 400. In this case, when the level of the clock signal 'CLK' is changed, the data level controller 10 can be configured to control the level of the clock signal 'CLK' to be lower or higher than the changed level after a predetermined time. In this way, it is possible to improve the transition speed of the clock signal 'CLK' when the level of the next clock signal is changed.

FIG. 7 is a waveform diagram illustrating voltage levels when the level of data is changed according one embodiment as compared to a conventional circuit.

In conventional circuit, data (represented by a solid line ①) has the ground voltage VSS as a low level and the external power supply voltage VDD as a high level. The level of data is changed from the low level to the high level or from the high level to the low level in the full swing range. The full swing causes an increase in rising time tr1 and falling time tf1.

In contrast, according to the embodiments described herein, (as represented by a dotted line ②), data is maintained at a level that is higher than the ground voltage VSS (hereinafter, referred to as a first level), and then changed to the external power supply voltage VDD. The data is maintained at the level of the external power supply voltage VDD for a predetermined time for which the data is processed by the data processing unit (see reference numeral 20 in FIG. 2). After the predetermined time has elapsed, the data is post-charged and stands by at a level that is lower than the external power supply voltage VDD (hereinafter, referred to as a second level). When the data is changed to a low level again, the data is maintained at the level of the ground voltage VSS for a predetermined time for which the data is processed. After the predetermined time has elapsed, the data is post-charged and stands by at the first level that is higher than the ground voltage VSS.

Therefore, according to the embodiments described herein, the swing range of data is smaller than that in a conventional circuit. Since the swing range of data is smaller, it is possible to shorten a rising time tr2 and a falling time tf2 while the level of data is changed. As can be seen from FIG. 7, it is possible to improve the rising time and the falling time by $\Delta tr$ and $\Delta tf$, respectively when using a circuit configured in accordance with the embodiments described herein.

In certain embodiments, the first level and the second level have different values. However, as described above, the first level and the second level can have the same level, for example, VDD/2.

As described above, according to the embodiments described herein, for a period for which a test mode is activated, when the level of data transmitted through the signal line is changed, the changed level of data can be maintained for a predetermined time. After the predetermined time has elapsed, the level of data can be controlled to be lower or higher than the changed level. That is, data can be post-charged. For example, when data is changed to the external power supply voltage level, the level of data can be controlled to be lower than the external power supply voltage. When data is changed to the ground voltage level, the level of data can be controlled to be higher than the ground voltage. In other words, while data is processed, it is changed to the external power supply voltage or the ground voltage level. After data is processed, the swing width of data is controlled to be smaller than a full swing width, which is the difference between the external power supply voltage and the ground voltage. Therefore, it is possible to improve the transition speed of the level of the data. In addition, since the swing width of data is reduced, it is possible to prevent an excessively large amount of current from flowing.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A circuit, comprising:
    a signal line configured to transmit signals; and
    a data level controller coupled with the signal line, the data level controller configured to control the swing range of signals on the signal line to be smaller than a full swing range, which is a potential difference between an external power supply voltage and a ground voltage, when the level of the data transmitted through the signal line is changed to an external power supply voltage level or a ground voltage level, wherein
    the data level controller includes:
        a delay unit configured to delay the data by a predetermined time when a level of the data changes;
        an inverting unit coupled with the delay unit, the inverting unit configured to invert an output signal from the delay unit, and the inverting unit including
            a pull-up element that responds to a low-level signal input to the inverting unit, and
            a pull-down element that responds to a high-level signal input to the inverting unit;
        a switching unit coupled with the inverting unit, the switching unit configured to transmits the signal output from the inverting unit; and
        a resistor unit that is connected to an output terminal of the switching unit.

2. The circuit of claim 1, wherein the delay unit comprises a plurality of delay elements configured to delay the data by the predetermined time.

3. The circuit of claim 1, wherein the switching unit is turned on in response to a test mode signal.

4. The circuit of claim 1, wherein the resistor unit interferes with the current flow of the output signal from the inverting unit.

5. A circuit, comprising:
    a signal line configured to transmit signals; and
    a data level controller coupled with the signal line, the data level controller configured to control the level of the data to be lower than an external power supply voltage after a predetermined time when the level of the data transmitted through the signal line is changed to an external power supply voltage level, and to control the level of the data to be higher than a ground voltage after the predetermined time when the level of the data is changed to a ground voltage level, wherein
    the data level controller includes:
        a delay unit configured to delay the data by a predetermined time when a level of the data changes;
        an inverting unit coupled with the delay unit, the inverting unit configured to invert an output signal from the delay unit, and the inverting unit including
            a pull-up element configured to respond to a low-level signal input to the inverting unit, and
            a pull-down element configured to respond to a high-level signal input to the inverting unit;
        a switching unit coupled with the inverting unit, the switching unit configured to transmit the signal from output the inverting unit; and
        a resistor unit that is connected to an output terminal of the switching unit.

6. The circuit of claim 5, wherein the delay unit comprises a plurality of delay elements configured to delay the data by the predetermined time.

7. The circuit of claim 5, wherein the switching unit is turned on in response to a test mode signal.

8. The circuit of claim 5, wherein the resistor unit interferes with the current flow of the output signal from the inverting unit.

* * * * *